(12) United States Patent
Cui et al.

(10) Patent No.: US 6,737,929 B1
(45) Date of Patent: May 18, 2004

(54) HYBRID N+ AND P+ GATE-DOPED VOLTAGE VARIABLE CAPACITORS TO IMPROVE LINEAR TUNING RANGE IN VOLTAGE CONTROLLED OSCILLATORS

(75) Inventors: Yan Cui, Gurnee, IL (US); Jyoti Mondal, Palatine, IL (US)

(73) Assignee: Motorola, Inc., Schaumburg, IL (US)

( * ) Notice: Subject to any disclaimer, the term of this patent is extended or adjusted under 35 U.S.C. 154(b) by 5 days.

(21) Appl. No.: 10/301,943

(22) Filed: Nov. 22, 2002

(51) Int. Cl.[7] .............................. H03B 5/08; H01L 29/92
(52) U.S. Cl. .............................. 331/177 V; 331/108 C; 331/117 R; 331/117 FE; 257/296; 257/595; 257/E29; 257/342
(58) Field of Search .......................... 331/108 C, 117 R, 331/117 FE, 117 D, 177 R, 177 V; 257/296, 595, E29.325, E29.342, E29.344

(56) References Cited

U.S. PATENT DOCUMENTS 6,351,020 B1  2/2002  Tarabbia et al. ............ 257/532

6,608,747 B1 * 8/2003 Ito ............................ 361/277

* cited by examiner

*Primary Examiner*—David Mis
(74) *Attorney, Agent, or Firm*—Fulbright & Jaworski LLP

(57) ABSTRACT

A method for operating a wide band voltage controlled oscillator comprises using a control voltage to tune the capacitance of at least one hybrid n+ and p+ gate-doped voltage variable capacitor of the wide band voltage controlled oscillator. A hybrid voltage variable capacitor includes a substrate, a well adjacent to the substrate, a first and second set of contact elements adjacent to the well, a first channel layer adjacent to the well and bound by the first set of contact elements, a first insulating layer adjacent to the first channel layer, a first electrode adjacent to the first insulating layer, a second channel layer adjacent to the well and bound by the second set of contact elements, a second insulating layer adjacent to the second channel layer, and a second electrode adjacent to the second insulating layer.

18 Claims, 3 Drawing Sheets

HYBRID N+ AND P+ GATE-DOPED VOLTAGE VARIABLE CAPACITORS TO IMPROVE LINEAR TUNING RANGE IN VOLTAGE CONTROLLED OSCILLATORS

BACKGROUND OF THE INVENTION

1. Field of the Invention

The invention relates generally to the field of voltage variable capacitors. More particularly, the invention relates to a hybrid voltage variable capacitor.

2. Discussion of the Related Art

A voltage-controlled oscillator (VCO) is a circuit that generates an oscillating signal at a frequency proportional to an externally applied control voltage. These types of circuits find several applications in telecommunications and are useful for tracking and matching signal frequencies as they shift due to thermal variations, power supply fluctuations, and other sources of frequency shifts.

Metal-oxide semiconductor (MOS) capacitors, also known in the art as voltage variable capacitors (VVCs), have been used in tank circuits of VCOs because of their high quality and good capacitance variation versus tuning voltage characteristics.

Capacitance variation range is an important consideration in VCO circuit design. Typically, the capacitance variation range of a MOS capacitor starts from a flat-band voltage to a threshold voltage, which may be less than 0.7 volts. Beyond this range, the MOS capacitor tuning (or control) voltage does not cause frequency change in the VCO. A narrow capacitance variation range results in a narrow VCO frequency range.

An unsatisfactory approach to increasing the frequency range of a VCO includes utilizing band switching circuits. Adding and deleting capacitance or inductance for each desired band of operation can cause a shift in the oscillation frequency of the VCO. Problems with this technology include the need for more logic control circuits, increased design complexity, and signal degradation.

Thus, there is need for a single wide band VCO with linear tuning range that does not require extra logic control circuits and/or increased design complexity.

SUMMARY OF THE INVENTION

There is a need for the following embodiments. Of course, the invention is not limited to these embodiments.

According to an aspect of the invention, a method for operating a wide band voltage controlled oscillator comprises using a control voltage to tune the capacitance of at least one hybrid n+ and p+ gate-doped voltage variable capacitor of the wide band voltage controlled oscillator.

According to another aspect of the invention, a hybrid voltage variable capacitor includes a substrate, a well adjacent to the substrate, a first and second set of contact elements adjacent to the well, a first channel layer adjacent to the well and bound by the first set of contact elements, a first insulating layer adjacent to the first channel layer, a first electrode adjacent to the first insulating layer, a second channel layer adjacent to the well and bound by the second set of contact elements, a second insulating layer adjacent to the second channel layer, and a second electrode adjacent to the second insulating layer; a capacitance of said hybrid voltage variable capacitor varying as a function of a voltage applied to said first and second set of contact elements.

These, and other, embodiments of the invention will be better appreciated and understood when considered in conjunction with the following description and the accompanying drawings. It should be understood, however, that the following description, while indicating various embodiments of the invention and numerous specific details thereof, is given by way of illustration and not of limitation. Many substitutions, modifications, additions and/or rearrangements may be made within the scope of the invention without departing from the spirit thereof, and the invention includes all such substitutions, modifications, additions and/or rearrangements.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore nonlimiting, embodiments illustrated in the drawings, wherein like reference numerals (if they occur in more than one view) designate the same or similar elements. The invention may be better understood by reference to one or more of these drawings in combination with the description presented herein. It should be noted that the features illustrated in the drawings are not necessarily drawn to scale.

DETAILED DESCRIPTION

The invention and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the invention in detail. It should be understood, however, that the detailed description and the specific examples, while indicating specific embodiments of the invention, are given by way of illustration only and not by way of limitation. Various substitutions, modifications, additions and/or rearrangements within the spirit and/or scope of the underlying inventive concept will become apparent to one of ordinary skill in the art from this disclosure.

Figure 1:
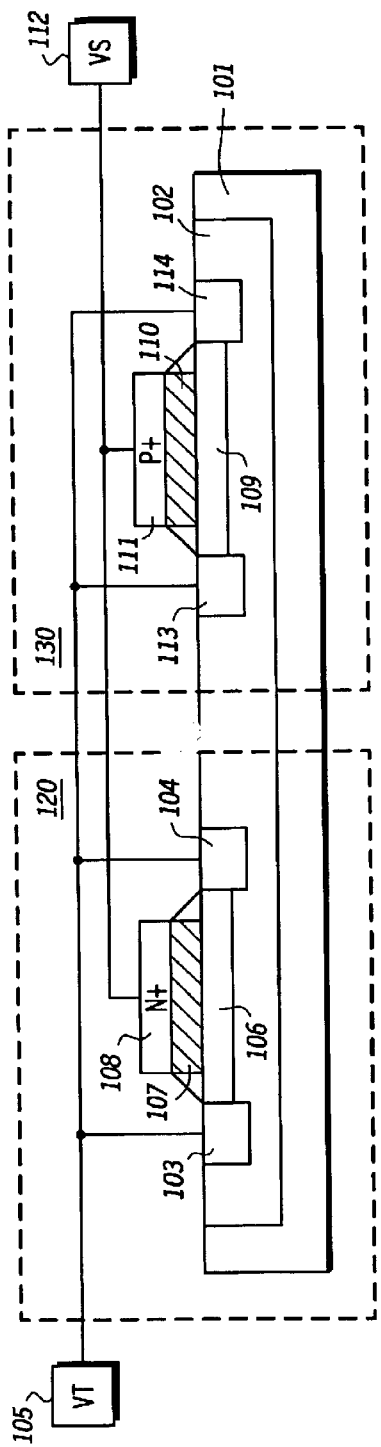
FIG. 1 is a cross-section of a hybrid n+ and p+ gate-doped voltage variable capacitor, representing an embodiment of the invention.

Referring to FIG. 1, a cross-section of a hybrid n+ and p+ gate-doped voltage variable capacitor (VVC) 100 is depicted according to an exemplary embodiment of the invention. The VVC 100 includes an n+ gate-doped VVC 120 and a p+ gate-doped VVC 130 in a parallel construction. A p-substrate 101 is adjacent to an n-well 102. The n-well 102 includes two pairs of n+ contact elements 103, 104 and 113, 114, each contact area being coupled to a control (or tuning) voltage 105. The first pair of n+ contact elements 103, 104 bounds an accumulated n-type channel 106. A first insulating layer 107 is adjacent to the n-type channel 106. The first insulating layer 107 is also adjacent to an n+ layer (n+ electrode) 108, defining the n+ gate-doped VVC 120. The second pair of n+ contact elements 113, 114 bounds another accumulated n-type channel 109. A second insulating layer 110 is adjacent to the n-type channel 109. The second insulating layer 110 is also adjacent to a p+ layer (p+ electrode) 111, defining the p+ gate-doped VVC 130. The n+ layer 108 and p+ layer 111 may be coupled to a voltage supply 112. In one embodiment, the first and second insulating layers 107, 110 are silicon dioxide layers ($SiO_2$).

A MOS capacitor is a serial combination of an oxide capacitance (oxidation layer) and a channel capacitance below the oxidation layer and on the semiconductor bulk side. In an n-well process, the n-well is fabricated on a p-substrate and the n-well is the semiconductor bulk of the MOS capacitor. The oxide capacitance is a fixed value, but the channel capacitance varies with different bias voltage between the gate and the bulk, and the MOS capacitor may be used as a voltage variable capacitor. The capacitance versus bias voltage (C-V curve) shifts according to different work function differences between the gate and the semiconductor bulk. Referring to the hybrid n+ and p+ gate-doped voltage variable capacitor (VVC) 100, since the p+ doped gate 111 and the n+ doped gate 108 have a work function difference approximately equal to the semiconductor band gap, the p+ gate-doped capacitor 130 has a shifted C-V curve from that of the n+ gate-doped capacitor 120.

Still referring to FIG. 1, the hybrid voltage variable capacitor 100 may be utilized in several applications. In one exemplary embodiment, the invention includes a voltage controlled oscillator with the hybrid voltage variable capacitor 100 in a tank circuit. The hybrid VVC 100 has a larger capacitance variation and linear tuning range compared to standard single n+ or p+ voltage variable capacitors. In another exemplary embodiment, the invention includes a wide band VCO including the hybrid VVC 100 and operable for use if multi-band applications. In a VCO design, the hybrid VVC 100 can improve the quality of a tank circuit and of the guard band while increasing production yield and simplifying circuit layout.

Figure 2:
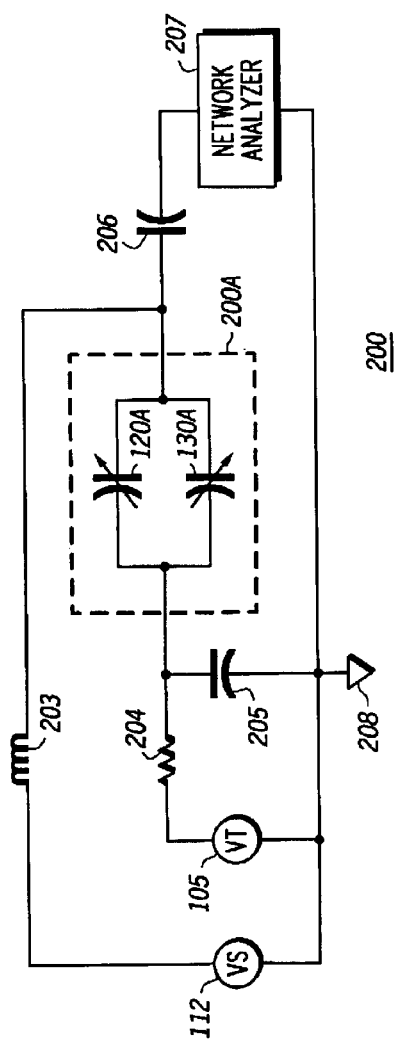
FIG. 2 is a combination circuit and block diagram of a simulated hybrid voltage variable capacitor in a capacitance measuring circuit, illustrating an aspect of the invention.

Referring to FIG. 2, a combination circuit and block diagram of a simulated hybrid voltage variable capacitor 200A in capacitance measuring circuit 200 is depicted according to one aspect of the invention. The circuit 200 can be used to determine the capacitance of the simulated hybrid VVC 200A (including an n+ gate-doped VVC 120A and a p+ gate-doped VVC 130A coupled in parallel) as a function of the tuning voltage 105. A voltage supply 112 is coupled to an inductor 203 and to a reference (ground) 208. The inductor 203 may be a large inductor (L~1H) to serve as an AC block. The tuning voltage 105 is coupled to the simulated hybrid VVC 200A via a filter comprising a resistor 204 and a fixed value capacitor 205. A network analyzer 207 is coupled to the simulated hybrid VVC 200A via another fixed value capacitor 206. The circuit 200 is a standard capacitance measuring circuit and its operation is well-known to one of ordinary skill in the art.

Still referring to FIG. 2, the network analyzer 207 may serve as a port termination, injecting a signal, measuring a reflection, and calculating a scattering parameter as function of the tuning voltage 105. By utilizing a relationship between the scattering parameter and capacitance, this procedure can yield a curve representing the capacitance of the simulated hybrid VVC 200A as function of the tuning voltage 105.

Figure 3:
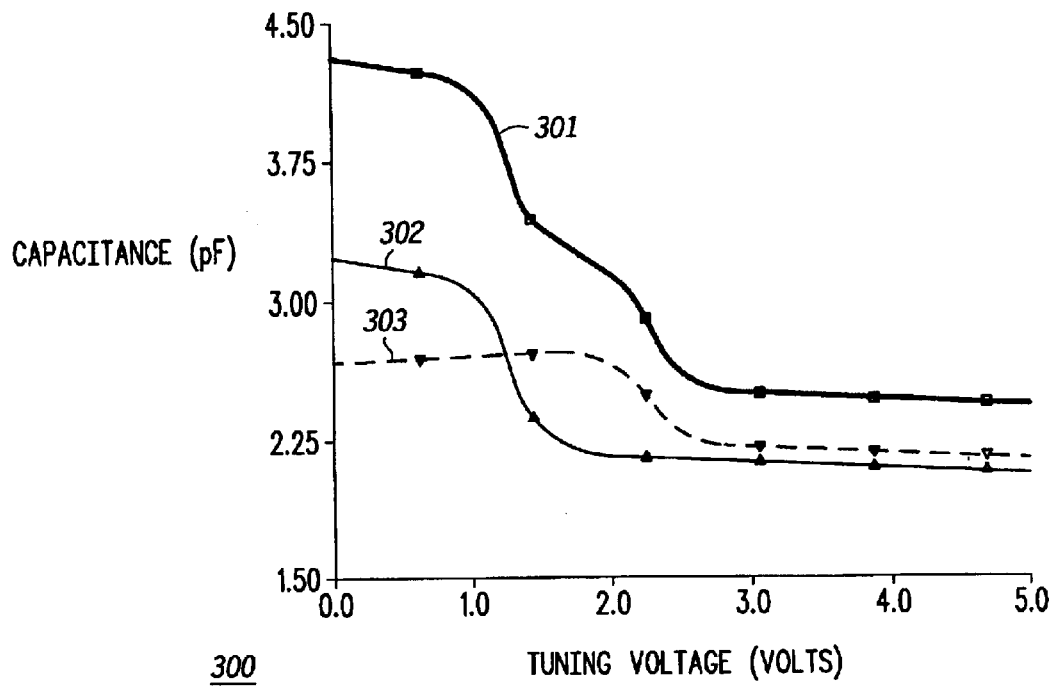
FIG. 3 is a graph of a capacitance as function of a control voltage for the circuit of FIG. 2, illustrating an aspect of the invention.

Referring to FIG. 3, a graph 300 of a capacitance as function of a control voltage for the circuit 200 of FIG. 2 is depicted illustrating an aspect of the invention. The vertical axis is a capacitance in picoFarads and the horizontal axis is the tuning voltage 105 in volts. With the frequency of the network analyzer 207 set at 3.7 GHz, the tuning voltage 112 was varied from 0 to 5 volts. A first curve 301 shows the simulated hybrid VVC 200A capacitance as function of the control voltage 105 according to the present invention. A second curve 302 shows the capacitance of a single p+ gate-doped capacitor replacing the simulated hybrid VVC 200A in circuit 200 as a function of the tuning voltage 105. Similarly, a third curve 303 shows the capacitance of a single n+ gate-doped capacitor replacing the simulated hybrid VVC 200A in circuit 200 as a function of the tuning voltage 105.

Still referring to FIG. 3, component values remained unchanged in all three simulations. Curves 301, 302 and 303 show that a hybrid n+ and p+ gate-doped VVC has a much larger capacitance variance range than single n+ gate-doped or p+ gate-doped VCCs. More specifically, the hybrid VVC 200A can provide a capacitance variation at least 3.1 times larger than a standard n+ gate-doped VVC and at least 1.8 larger than a standard p+ gate-doped VVC. Further, the hybrid VVC 200A can provide a substantially larger VCO tuning range than standard n+ gate-doped or p+ gate-doped VVCs.

Figure 4:
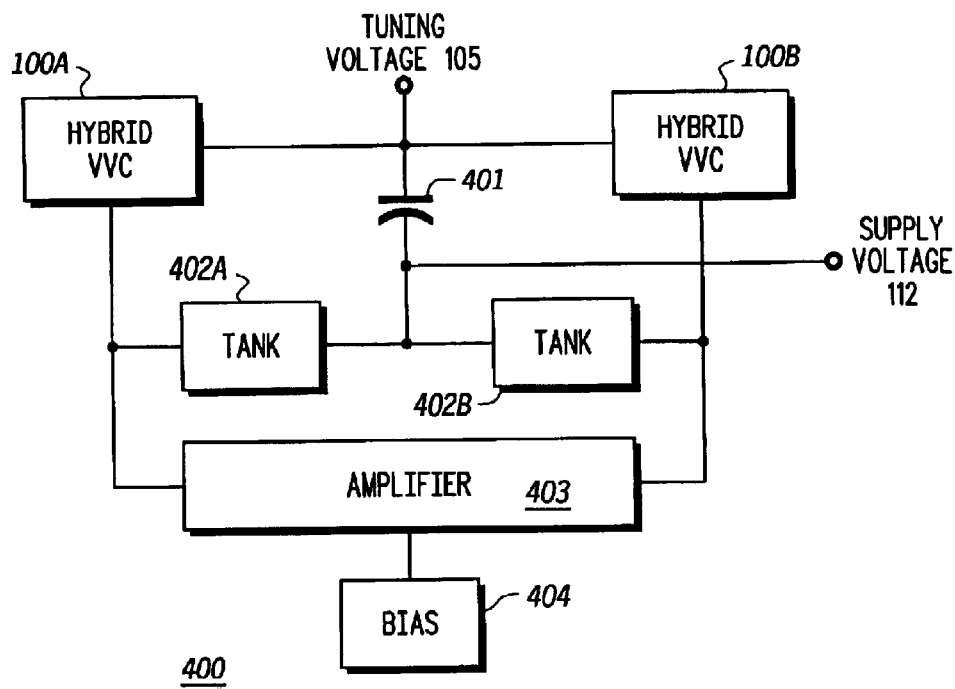
FIG. 4 is a block diagram of a wide band voltage controlled oscillator with a hybrid voltage variable capacitance circuit, representing an embodiment of the invention.

Referring to FIG. 4, a block diagram of a wide band voltage controlled oscillator 400 with hybrid voltage variable capacitance circuits 100A, 100B is depicted representing an exemplary embodiment of the invention. A tuning voltage 105 is coupled to the pair of hybrid VVC circuits 100A, 100B and to tank circuits 402A, 402B via a fixed value capacitor 401. A voltage supply 112 is coupled to a node between the tank circuits 402A, 402B. The tank circuits 402A, 402B are coupled to an amplifier circuit 403. The amplifier circuit 403 is coupled to a bias (or enable) circuit 404.

When in operation, the tank circuits 402A, 402B oscillate with the amplifier circuit 403. As one of ordinary skill in the art will recognize in light of this disclosure, the hybrid VVC circuits 100A, 100B may be seen as part of the tank circuits 402A, 402B. The tuning voltage 105 may change the capacitance of the hybrid VVCs 100A, 100B causing the output frequency of the VCO 400 to vary. The bias circuit 404 may enable or disable operation of the VCO 400. This type of circuit finds several applications in telecommunications, and is useful for tracking and matching signal frequencies as they shift due to thermal variations, power supply fluctuations, and other sources of frequency shifts.

Figure 5:
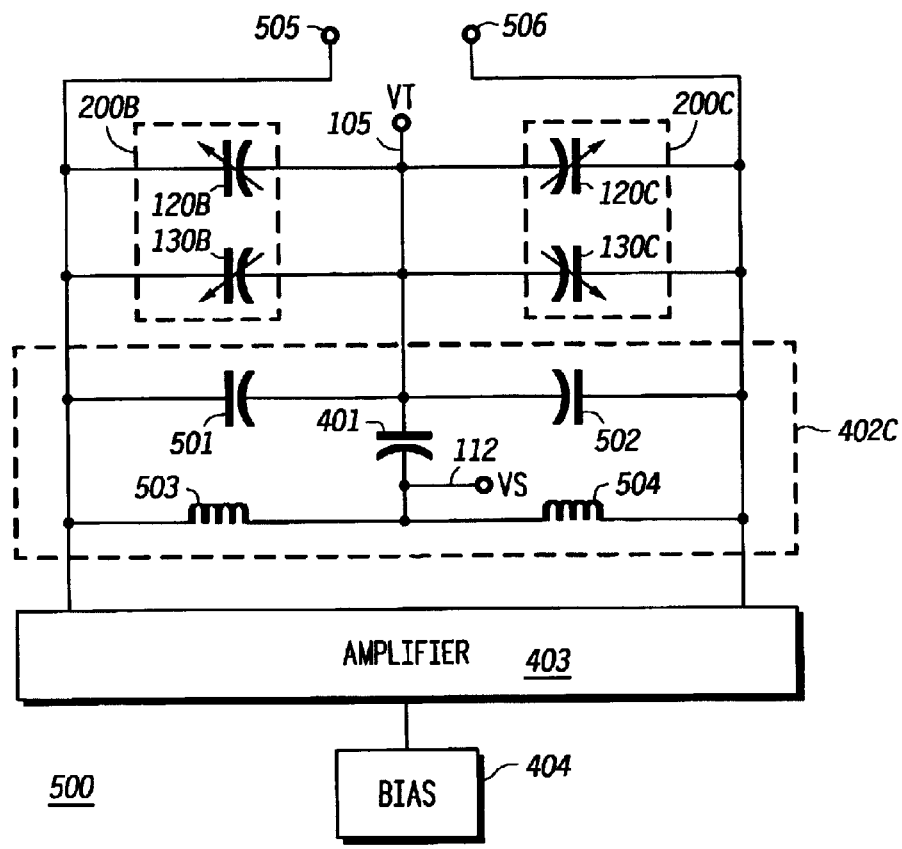
FIG. 5 is a circuit diagram of a wide band voltage controlled oscillator with a simulated hybrid voltage variable capacitor circuit, representing an embodiment of the invention.

Referring to FIG. 5, a circuit diagram of a wide band voltage controlled oscillator 500 with hybrid voltage variable capacitor circuits 200B, 200C is depicted according to one aspect of the invention. The tuning voltage 105 is coupled to the pair of simulated hybrid VVC circuits 200B, 200C and to a tank circuit 402C. The hybrid VVC circuit 200B includes a first n+ gate-doped capacitor 120B in parallel with a first p+ gate-doped capacitor 130B. The hybrid VVC circuit 200C includes a second n+ gate-doped capacitor 120C in parallel with a second p+ gate-doped capacitor 130C. The voltage supply 112 is coupled to a node between a pair of inductors 503, 504 in the tank circuit 402C. The tank circuit 402C further includes second, third, and fourth fixed valued capacitors 501, 502, 401 and it is coupled to the amplifier circuit 403. The amplifier circuit 403 is coupled to the bias (or enable) circuit 404.

When in operation, the tuning voltage 105 may change the capacitance of the hybrid VVC circuits 200B, 200C, thereby determining the output frequency of the VCO 500. The output of the VCO 500 may be differentially probed at outputs 505, 506. In practice, the pair of simulated hybrid VVC circuits 200B, 200C may be seen as an integral tuning branch of the tank circuit 402C.

Figure 6:
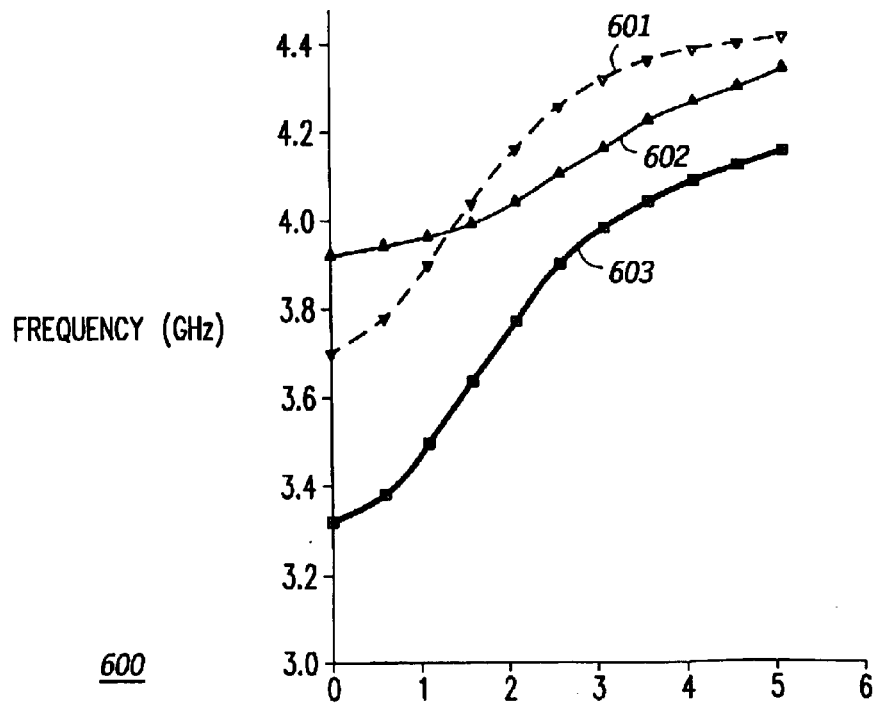
FIG. 6 is a graph of a voltage controlled oscillator frequency versus control voltage for the circuit of FIG. 5, illustrating an aspect of the invention.

Referring to FIG. 6, a graph 600 of a simulated voltage controlled oscillator frequency versus tuning voltage for the circuit 500 of FIG. 5 is depicted illustrating one aspect of the invention The vertical axis is the output frequency of the VCO 500 in GHz. The horizontal axis is the tuning voltage 105 in volts and as detailed in FIG. 5. In one simulation 603, the frequency span of the hybrid VCO 500 according to the present invention was seen to be 857 MHz. The frequency span of the hybrid VCO 500 may cover the quad-band GSM VCO and may provide a 200 MHz guard band on both high and low sides. In another simulation 601, the frequency span of the VCO 500 with p+ gate-doped VVCs replacing the hybrid VVCs 200B, 200C was seen to be 698 MHz. In another simulation 602, the frequency span of the VCO 500 with n+ gate-doped VVCs replacing the hybrid VVCs 200B, 200C was seen to be 389 MHz.

In one embodiment, the invention includes a hybrid structure comprising two parallel VVCs of different n+ and/or p+ dopant density in the gates for further expansion of its tuning range. In another embodiment, the invention, includes a structure of several hybrid VVCs in a parallel construction.

The particular manufacturing process used for the hybrid n+ and p+ gate-doped voltage variable capacitor of the present invention is within the skill level of one of ordinary skill in the art and is not essential as long as it provides the described functionality. Normally those who make or use the invention may select the manufacturing process based upon tooling and energy requirements, the expected application requirements of the final product, and the demands of the overall manufacturing process, as known in the art.

The terms a or an, as used herein, are defined as one or more than one unless the specification explicitly states otherwise. The term plurality; as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

The appended claims are not to be interpreted as including means-plus-function limitations, unless such a limitation is explicitly recited in a given claim using the phrase(s) "means for" and/or "step for." Subgeneric embodiments of the invention are delineated by the appended independent claims and their equivalents. Specific embodiments of the invention are differentiated by the appended dependent claims and their equivalents.

What is claimed is:

1. A method for operating a wide band voltage controlled oscillator, comprising using a control voltage to tune the capacitance of at least one hybrid n+ and p+ gate-doped voltage variable capacitor of the wide band voltage controlled oscillator.

2. The method of claim 1, further comprising using a supply voltage to bias the hybrid n+ and p+ gate-doped voltage variable capacitor.

3. The method of claim 1, the hybrid n+ and p+ gate-doped voltage variable capacitor comprising a hybrid metal-oxide semiconductor structure comprising n+ and p+ gate-doped voltage variable capacitors in a parallel construction.

4. A hybrid voltage variable capacitor, comprising:
   a substrate;
   a well adjacent to the substrate;
   a first and second set of contact elements adjacent to the well;
   a first channel layer adjacent to the well and bound by the first set of contact elements;
   a first insulating layer adjacent to the first channel layer;
   a first electrode adjacent to the first insulating layer;
   a second channel layer adjacent to the well and bound by the second set of contact elements;
   a second insulating layer adjacent to the second channel layer; and
   a second electrode adjacent to the second insulating layer;
   a capacitance of said hybrid voltage variable capacitor varying as a function of a voltage applied to said first and second set of contact elements.

5. The hybrid voltage variable capacitor of claim 4, the substrate comprising a p-type substrate.

6. The hybrid voltage variable capacitor of claim 4, the well comprising an n-type well.

7. The hybrid voltage variable capacitor of claim 4, the first and second set of contact elements comprising n+ contact elements.

8. The hybrid voltage variable capacitor of claim 4, the first electrode comprising an n+ electrode.

9. The hybrid voltage variable capacitor of claim 4, the second electrode comprising a p+ electrode.

10. The hybrid voltage variable capacitor of claim 4, the first and second insulating layers comprising a silicon dioxide layer.

11. The hybrid voltage variable capacitor of claim 4, the first and second contact elements being operable to connect to a tuning voltage.

12. The hybrid voltage variable capacitor of claim 4, the first and second electrodes being operable to connect to a supply voltage.

13. A hybrid voltage variable capacitance structure, comprising at least two parallel n+ and p+ hybrid voltage variable capacitors in a parallel configuration, each hybrid capacitor including:
   a substrate;
   a well adjacent to the substrate;
   a first and second set of contact elements adjacent to the well;
   a first channel layer adjacent to the well and bound by the first set of contact elements;
   a first insulating layer adjacent to the first channel layer;
   a first electrode adjacent to the first insulating layer;
   a second channel layer adjacent to the well and bound by the second set of contact elements;
   a second insulating layer adjacent to the second channel layer; and
   a second electrode adjacent to the second insulating layer;
   a capacitance of said hybrid voltage variable capacitance structure varying as a function of a voltage applied to said first and second set of contact elements.

14. The hybrid voltage variable capacitance structure of claim 13, the gates of the parallel n+ and p+ hybrid voltage variable capacitors having different n+ dopant densities.

15. The hybrid voltage variable capacitance structure of claim 13, the gates of the parallel n+ and p+ hybrid voltage variable capacitors having different p+ dopant densities.

16. A wide band voltage controlled oscillator, comprising:
at least one hybrid n+ and p+ gate-doped voltage variable capacitor;
at least one tank circuit coupled to the hybrid n+ and p+ gate-doped voltage variable capacitor;
an amplifier circuit coupled to the tank circuit; and
a bias circuit coupled to the amplifier circuit.

17. The wide band voltage controlled oscillator of claim 16, the hybrid n+ and p+ gate-doped voltage variable capacitor receiving a control voltage for tuning the capacitance of the hybrid n+ and p+ gate-doped voltage variable capacitor.

18. The wide band voltage controlled oscillator of claim 16, the hybrid n+ and p+ gate-doped voltage variable capacitor receiving a supply voltage for biasing the hybrid n+ and p+ gate-doped voltage variable capacitor.

* * * * *